(12) United States Patent
Ishii

(10) Patent No.: US 6,462,875 B1
(45) Date of Patent: Oct. 8, 2002

(54) DIFFRACTIVE OPTICAL ELEMENT

(75) Inventor: Hiroyuki Ishii, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/487,305

(22) Filed: Jan. 19, 2000

(30) Foreign Application Priority Data

Jan. 19, 1999 (JP) .......................................... 11-010987

(51) Int. Cl.$^7$ .............................. G02B 5/18; G02B 5/32
(52) U.S. Cl. ...................... 359/576; 359/571; 359/569; 359/16; 359/9
(58) Field of Search ................................ 359/576, 571, 359/575, 569, 558, 9, 15, 16

(56) References Cited

U.S. PATENT DOCUMENTS

| | | | | |
|---|---|---|---|---|
| 4,221,465 A | | 9/1980 | Hannan et al. | |
| 5,031,991 A | * | 7/1991 | Nakatsu et al. | 359/565 |
| 5,245,596 A | | 9/1993 | Gupta et al. | |
| 5,258,871 A | | 11/1993 | Gupta | |
| 5,694,230 A | * | 12/1997 | Welch | 359/13 |
| 5,764,343 A | * | 6/1998 | Tanaka | 359/558 |
| 5,774,239 A | * | 6/1998 | Feldman et al. | 359/9 |
| 5,914,811 A | * | 6/1999 | Chen et al. | 359/495 |
| 5,978,153 A | * | 11/1999 | Nishio | 359/690 |

FOREIGN PATENT DOCUMENTS

EP 0 807 842 11/1997

* cited by examiner

*Primary Examiner*—Jon Henry
(74) *Attorney, Agent, or Firm*—Fitzpatrick, Cella, Harper & Scinto

(57) ABSTRACT

A diffractive optical element has a plurality of step-like patterns each having surface levels of a number less than eight, the step-like patterns being disposed in combination to provide a function of a step-like structure of eight or more levels.

14 Claims, 13 Drawing Sheets

DIFFRACTIVE OPTICAL ELEMENT

FIELD OF THE INVENTION AND RELATED ART

This invention relates to a diffractive optical element, an optical system or an exposure apparatus having such diffractive optical element, and a device manufacturing method using such exposure apparatus.

Semiconductor device manufacturing technology has advanced remarkably, as have microprocessing techniques. Recently, reduction projection exposure apparatuses ("steppers") having a resolving power on the submicron order are used prevalently in microprocessing works. Much research has been done to further improve resolving power. For example, the numerical aperture (NA) of projection optical systems have been enlarged, exposure wavelength has been reduced (narrowed), and novel optical elements, such as diffractive optical elements, have been used. Diffractive optical elements are optical elements having a plurality of predetermined concentric and step-like patterns formed on their surface. The patterns diffract light, incident thereon, at a desired deflection angle. These patterns are very thin, and occupy a very small space, and correct well for chromatic aberration.

A diffractive optical element can be formed with an ideal shape (blazed shape) if the steps (surface level differences) of the step-like pattern are formed very small. As such, a very fine structure may be formed. For example, in order to provide a step-like pattern for a four-level structure, the patterning operation must be done twice. In order to provide a step-like pattern for an eight-level structure, the patterning operation must be done three times. Particularly, in order to produce a step-like structure for eight or more levels, an etching operation must be done to a substrate with a relatively large surface step or steps. With such a substrate, it is very difficult to form each step into an exact, predetermined rectangular shape. Furthermore, there is a high probability that the desired rectangular shape will be flawed. An example of such a flaw would be an edge that is undesirably rounded. Such an error in the desired step-like pattern shape will cause a decrease of diffraction efficiency and an increase of unwanted diffraction light. Such errors result in degradation of the optical performance.

SUMMARY OF THE INVENTION

It is an object of the present invention to provide a diffractive optical element by which degradation of the optical performance such as described above can be prevented or reduced effectively.

It is another object of the present invention to provide an optical system or an exposure apparatus having such a diffractive optical element.

It is a further object of the present invention to provide a device manufacturing method using such an exposure apparatus.

In accordance with an aspect of the present invention, there is provided a diffractive optical element, comprising a plurality of step-like patterns each having surface levels of a number less than eight, said step-like patterns being disposed in combination to provide a function of a step-like structure of eight or more levels.

In one preferred form of this aspect of the present invention, two of said plurality of step-like patterns are disposed parallel to and opposed to each other.

In one preferred form of this aspect of the present invention, each of the steps of said plurality of step-like patterns have a width of 1 micron or more, wherein each of the steps of said step-like structure of eight or more levels have a width of 1 micron or less, and said step-like structure as a whole can serve as a diffractive optical element for diffracting light, incident thereon, at a desired deflection or diffraction angle.

In one preferred form of this aspect of the present invention, said step-like structure can serve as a phase type computer hologram for forming a desired light pattern.

In one preferred form of this aspect of the present invention, a clearance is formed between the step-like patterns opposed to each other, and the clearance is held in a vacuum state or is sealingly filled with a predetermined fluid.

In accordance with another aspect of the present invention, there is provided an optical system, comprising: a diffractive optical element as described above; and at least one lens disposed in front of or at a back of said diffractive optical element.

In accordance with a further aspect of the present invention, there is provided a projection exposure apparatus, comprising: a light source for producing illumination light; a first optical system for projecting the illumination light to a reticle, and a second optical system for projecting a pattern of the reticle onto a substrate, with light passed through the reticle; wherein at least one of said first and second optical systems includes a diffractive optical element as described above.

In accordance with a yet further aspect of the present invention, there is provided a device manufacturing method, comprising the steps of: applying a photosensitive material to a substrate; exposing the substrate coated with the photosensitive substrate, with a device pattern by use of an exposure apparatus as described above; and developing the exposed substrate.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention for a diffractive optical element will now be described in detail, with reference to the accompanying drawings.

First Embodiment

Figure 1:
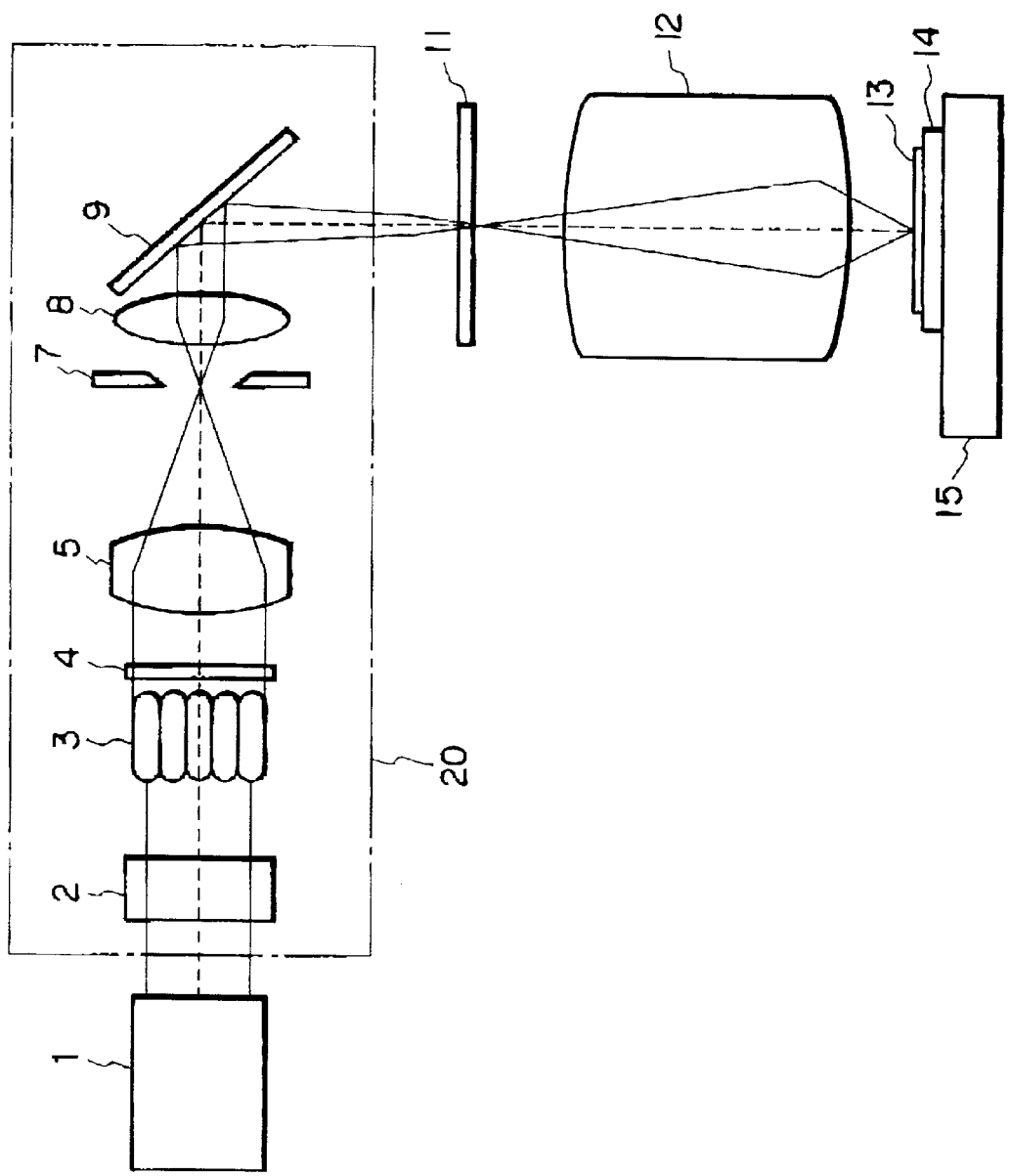
FIG. 1 is a schematic view of a general structure of a stepper, according to a first embodiment of the present invention.

A first embodiment will now be described. FIG. 1 is a schematic view of a general structure of a projection exposure apparatus (stepper) according to a first embodiment of the present invention This stepper comprises an illumination optical system (first optical system) 20 for projecting illumination light onto a reticle 11 having a desired pattern formed thereon, a projection optical system (second optical system) 12 for receiving light, passed through the reticle 11, and for projecting the pattern of the reticle 11 onto the surface of a wafer 13 in a reduced scale, a wafer chuck 14 for holding the wafer 13 thereon, and a wafer stage 15 on which the wafer chuck 14 is fixedly mounted.

The illumination optical system 20 includes a light source 1 for emitting the illumination light which is a high luminance ArF excimer laser light, in this example, beam shape transforming means 2 for transforming the illumination light from the light source 1 into a desired beam shape, and an optical integrator 3 having a plurality of cylindrical lenses or small lenses arrayed two-dimensionally. The illumination optical system further includes a stop member 4 which is disposed in proximity to secondary light sources, produced by the optical integrator 3, and which has interchangeable stops selected as desired by using interchanging means (not shown), a condenser lens 5 for collecting the illumination light passed through the stop member 4, and a blind 7 having, for example, four variable blades and being disposed at a plane optically conjugate with the reticle 11 to determine a desired illumination range upon the surface of the reticle 11. The illumination optical system further includes an imaging lens 8 for projecting the illumination light, in a shape determined by the blind 7, onto the surface of the reticle 11, and a deflecting mirror 9 for reflecting the illumination light from the imaging lens 8 toward the reticle 11.

Figure 2:
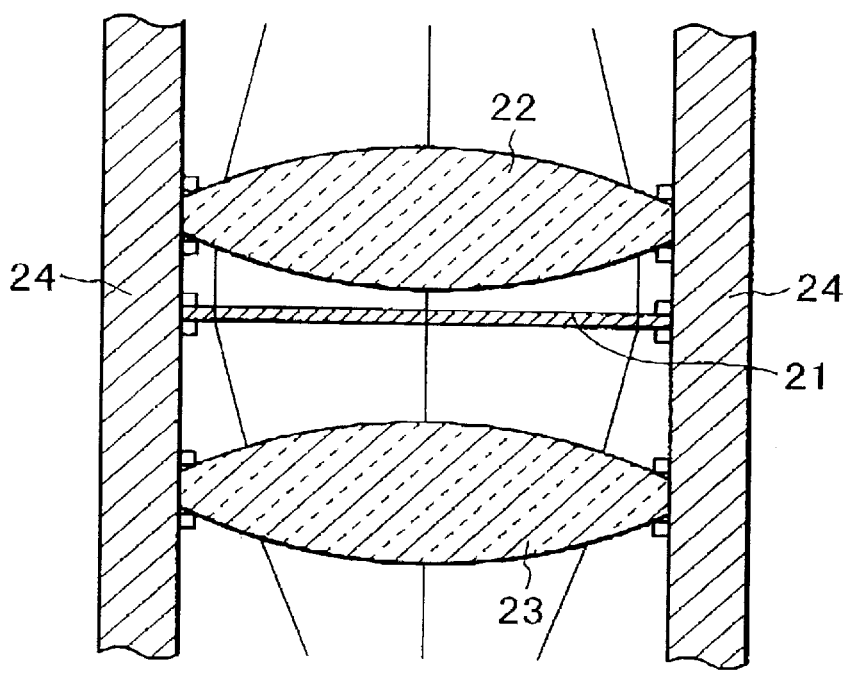
FIG. 2 is a schematic and sectional view of a projection optical system which is a component of the stepper of the FIG. 1 embodiment

The projection optical system 12 includes a lens group having a front lens 22 and a rear lens 23 (FIG. 2) as well as a diffractive optical element 21 disposed between the lenses 22 and 23, all of which are held inside a barrel 24.

The diffractive optical element 21 comprises optical elements 31 and 32 (FIGS. 3A and 3B) which are held fixedly with their pattern bearing surfaces disposed opposite to each other. Each of these optical elements has a very small thickness (about 1 mm) as compared with the diameter (about 120 mm) thereof.

The optical elements 31 and 32 are made of silica or quartz, and they function to diffract light, incident thereon, at a desired deflection angle. They correct well for chromatic aberration. The refractive index of quartz with respect to ArF excimer laser light (wavelength 193 nm) is 1.5602.

Figure 4A:
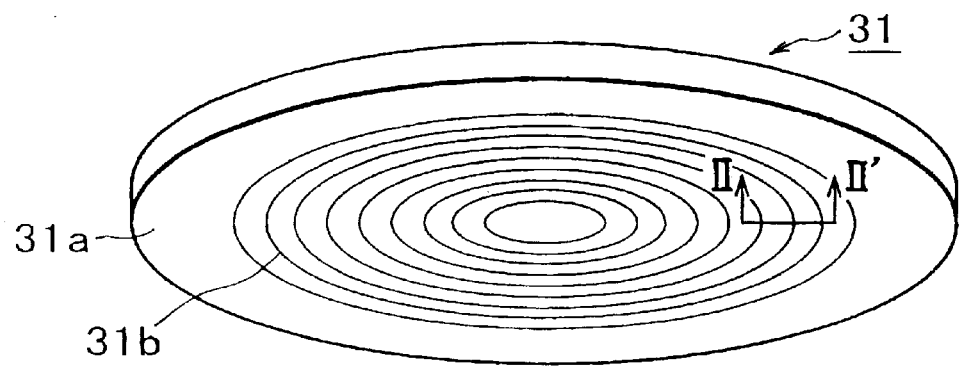
FIGS. 4A, 4B, 4C and 4D are schematic views, respectively, for explaining the structure of the diffractive optical element of FIGS. 3A and 3B.
Figure 4B:
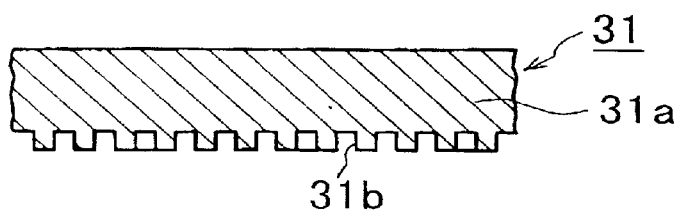
Figure 4C:
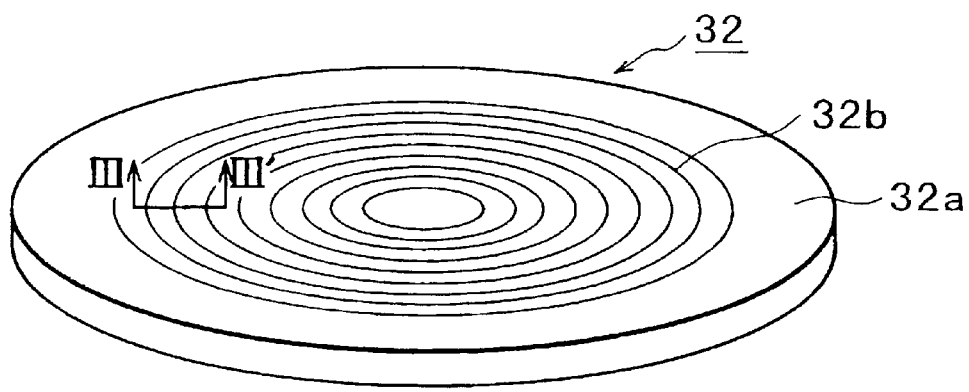
Figure 4D:
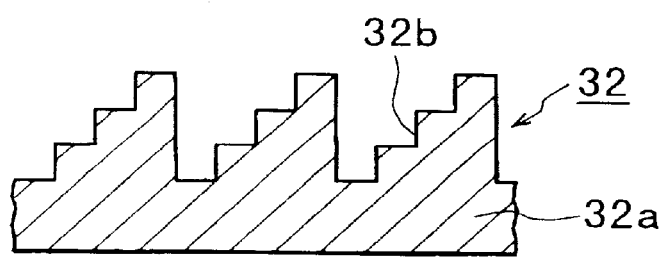

As shown in FIG. 4A, the optical element 31 comprises a disk-like substrate 31a with a diameter of about 120 nm, for example, on which a concentric diffractive pattern 31b (height of about 43 nm) is formed. As shown in FIG. 4B which is a sectional view taken on a line II–II' in FIG. 4A, the diffractive pattern 31b is formed with a two-level fine step-like shape (binary shape), and the pitch of the surface steps changes toward the outside of the concentric circles. On the other hand, as shown in FIG. 4C, the optical element 32 comprises a disk-like substrate 32a on which a concentric diffractive pattern 32b (each step height is about 86 nm) is formed. As shown in FIG. 4D which is a sectional view taken on a line III–III' in FIG. 4C, the diffractive pattern 32b is formed with a four-level fine step-like shape (binary shape). Similar to the diffractive pattern 31b, the condition such as pitch or depth of the surface steps on the diffractive pattern 32b changes toward the outside of the concentric circles.

This example is particularly effective for a diffractive optical element having a fine diffractive pattern (i.e., where each of the steps of the step-like shape of a combined diffractive pattern structure has a width of 1 micron or smaller). In this example, regardless of whether each of the steps of a step-like shapes of the diffractive patterns 31b and 32b of the optical elements 31 and 32 to be disposed in a pile has a width more than 1 micron, the width of each of the steps of the step-like shape of the combined diffractive pattern structure cannot be made greater than 1 micron As regards the material of the optical elements 31 and 32, a glass material such as fluorite may be used in place of quartz.

Figure 3A:
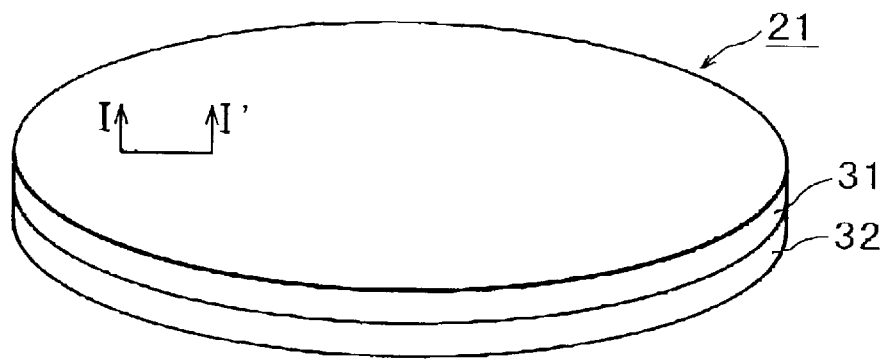
FIGS. 3A and 3B are schematic views, respectively, for explaining a diffractive optical element provided in the projection optical system of the stepper of the FIG. 1 embodiment.
Figure 3B:
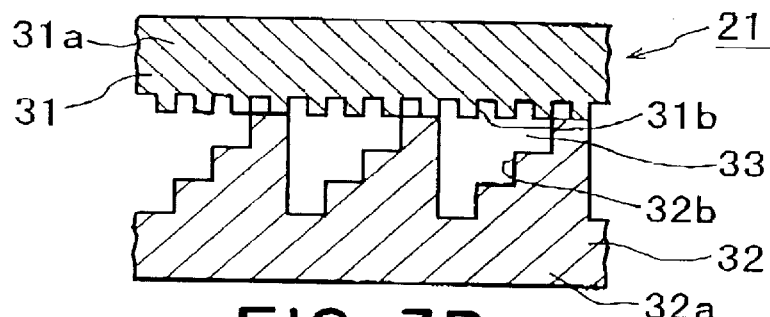

As shown in FIG. 3B, which is a sectional view taken on a line I–I' in FIG. 3A, the optical elements 31 and 32 are bonded together while being aligned with each other, with their portions being in contact with each other, whereby a diffractive optical element 21 is provided. Here they are aligned together so that two steps of the diffractive pattern 31b are mated with one step of the diffractive pattern 32b. Optically viewing this while taking the vertical direction in FIG. 3B (longitudinal direction in the drawing) as an optical axis direction, the diffractive patterns 31b and 32b as placed in pile provide a combined step-like pattern structure of eight levels (steps). Because of the combined function of the diffractive patterns 31b and 32b and in regard to the optical path lengths of eight light rays passing through each of the steps of the combined diffractive pattern structure, the structure is substantively equivalent to a diffractive optical element 37 (FIG. 6) having an eight-level diffractive pattern 38.

Figure 5:
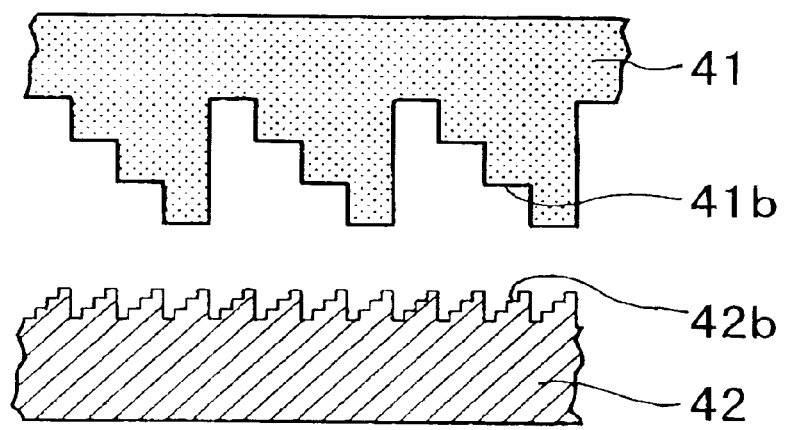
FIG. 5 is a schematic and sectional view of a diffractive optical element having a combined step-like pattern with sixteen levels.

Also, where two optical elements 41 and 42 (FIG. 5), each having a four-level structure, are used and placed in pile, a combined diffractive pattern structure of sixteen levels can be provided. In this example, they are aligned together with one step of the diffractive pattern 41b being mated with four steps of the diffractive pattern 42b. Optically viewing this while taking the vertical direction in FIG. 5 (longitudinal direction in the drawing) as an optical axis direction, the diffractive patterns 41b and 42b as placed in a pile provide a combined step-like pattern structure of sixteen levels (steps). In this manner, a multi-step pattern structure having more then eight levels can be provided and diffraction efficiency significantly can be improved.

Figure 6:
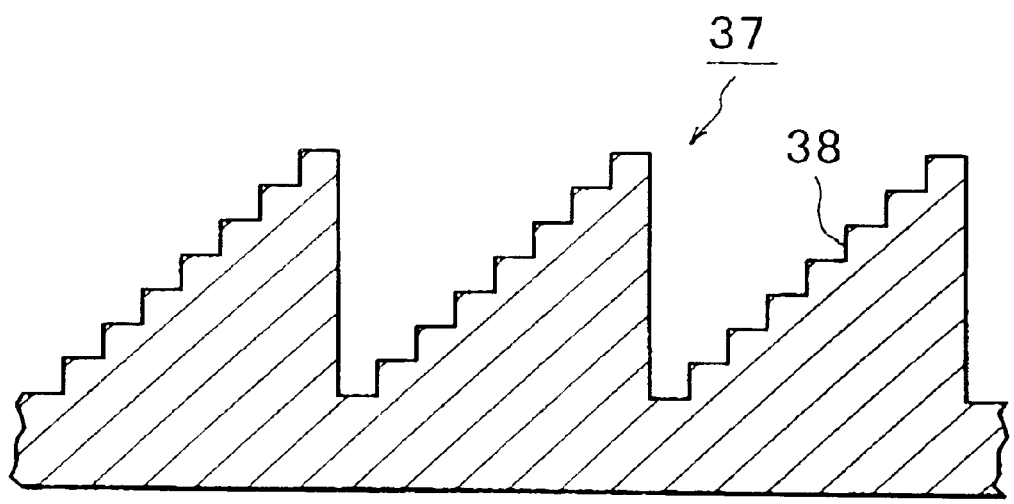
FIG. 6 is a schematic and sectional view of a diffractive optical element having a step-like pattern with eight levels.

Generally, a diffractive optical element is very thin as compared with a lens system of a multi-layered structure to be used for a similar purpose of chromatic aberration correction, it can be disposed at various locations in a variety of optical instruments. On the other hand, however, in order to produce a diffractive pattern of a shape close to an idealistic shape (blazed shape), the step-like structure must be formed very fine. Thus, an extraordinarily precise patterning operation is required if an eight-level surface step structure such as shown in FIG. 6 is to be produced.

In this embodiment, an eight-level structure is bisected in its height direction (a direction in which a phase difference is applied). Namely, an optical element 31 having a diffractive pattern 31b with a two-level shape and an optical element 32 having a diffractive pattern 32b with a four-level shape are combined together, by which a desired diffractive pattern of eight-level shape is accomplished substantively and easily.

When the optical elements 31 and 32 are bonded together, closed spaces 33 are defined therebetween. These spaces may be held in a vacuum state or they may be sealingly filled with a desired fluid, in accordance with the property of light source used. Depending on the wavelength of laser light used, an inert gas such as nitrogen gas, a helium gas or a dry air preferably may be used instead of fluid.

The manner of producing such a diffractive optical element 21 having a structure as described above, will be explained below.

Figure 7A:
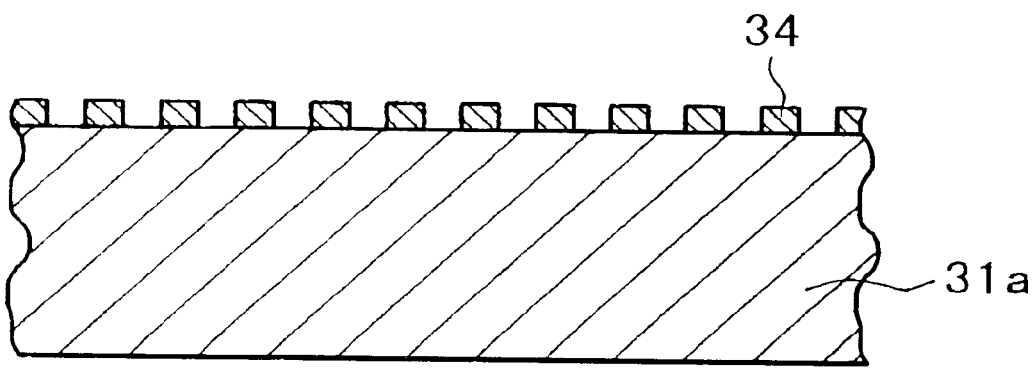
FIGS. 7A, 7B and 7C are schematic views, respectively, for explaining processes for producing a diffractive optical element.

First, for producing an optical element 31 as shown in FIG. 7A, a photoresist 34 is applied to the surface of the disk-like substrate 31a, and then the photoresist 34 is processed by photolithography. There may be cases wherein the area of the disk-like substrate 31 is so wide that it cannot be covered by a single exposure process. In that situation, because the exposure area has a revolutionally symmetrical shape, the exposure area may be divided into plural zones (segments) and exposures may be done while rotating the disk-like substrate 31a (i.e., rotational exposure).

Figure 7B:
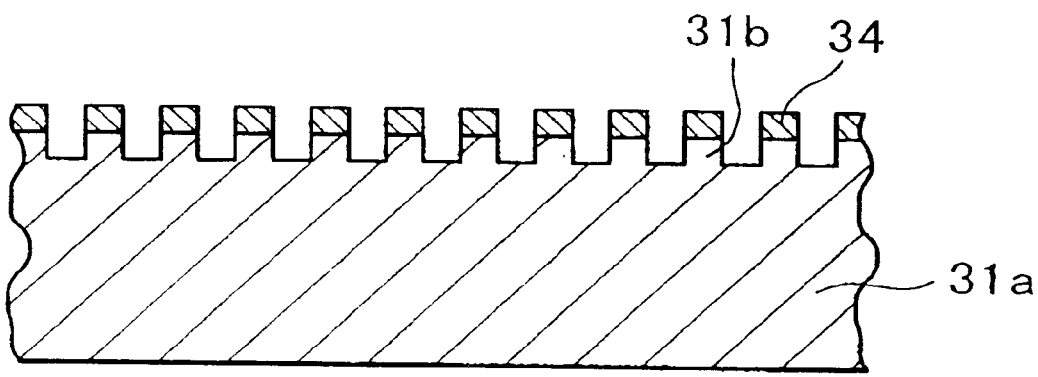
Figure 7C:
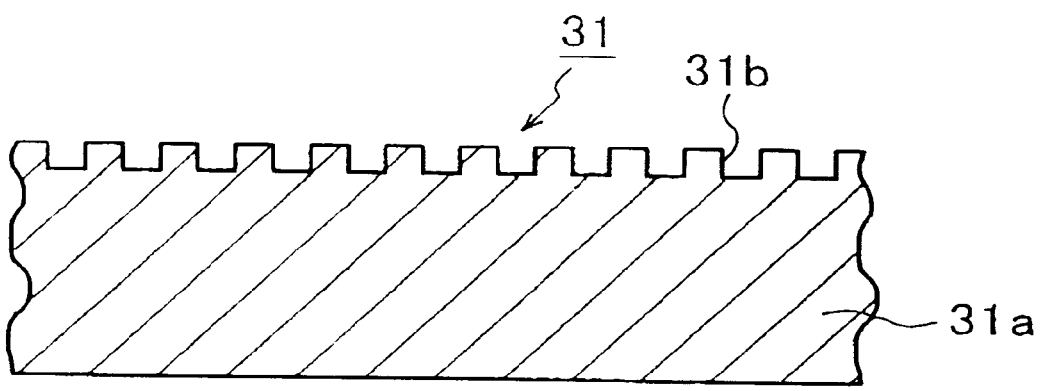

Subsequently, as shown in FIG. 7B, a dry etching process is done while using the photoresist 34 as a mask, whereby a patterning operation is performed. Thereafter, the photoresist 34 is removed by an ashing operation or the like. By this, as shown in FIG. 7C, a concentric diffractive pattern 31b with two levels (steps) is produced. Thus, an optical element 31 is accomplished.

Figure 8A:
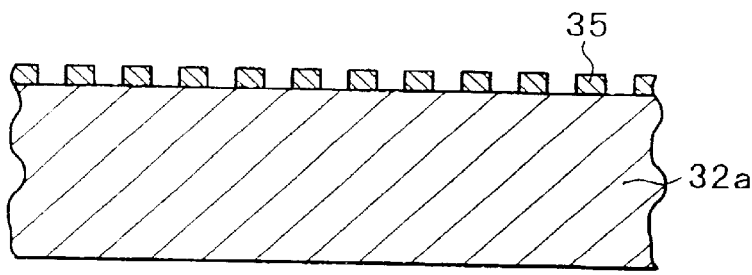
FIGS. 8A, 8B, 8C, 8D and 8E are schematic views, respectively, for explaining processes for producing a diffractive optical element.
Figure 8B:
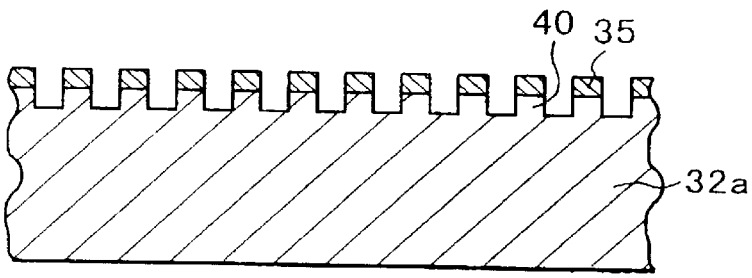

On the other hand, to produce an optical element 32 as shown in FIG. 8A, a photoresist 35 is applied to the surface of a disk-like substrate 32a, and then the photoresist 35 is processed by photolithography based on rotational exposure. Subsequently, as shown in FIG. 8B, a dry etching process is performed, using the photoresist 35 as a mask, whereby a patterning operation is carried out. Thereafter, the photoresist 35 is removed via an ashing operation or the like. Through this method, a concentric diffractive pattern 40 with two levels (steps), similar to the diffractive pattern 31b, is produced.

Figure 8C:
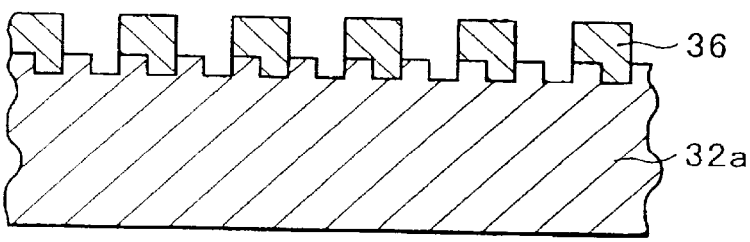
Figure 8D:
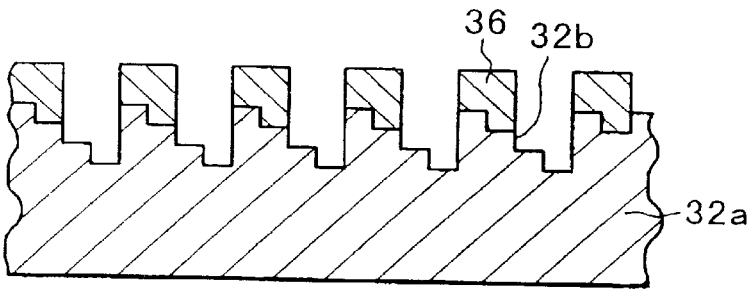
Figure 8E:
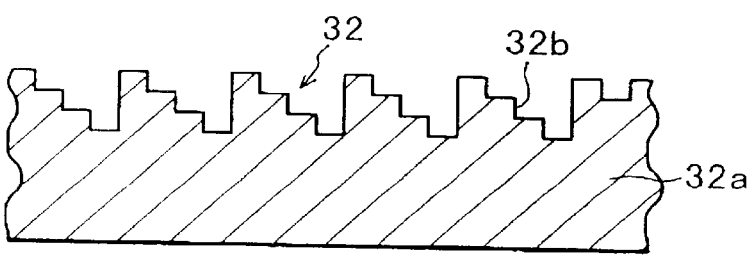

Subsequently, as shown in FIG. 8C, a photoresist 36 is applied to the surface of the disk-like substrate 32a, and then the photoresist 36 is processed by photolithography based on rotational exposure. Here, the photoresist 36 is processed in the manner that only two steps of every four steps of the diffractive pattern 40 are covered by the resist. Then, as shown in FIG. 8D, a dry etching process is done while using the photoresist 36 as a mask, whereby a patterning operation is performed. Thereafter, the photoresist 36 is removed by an ashing operation or the like. By this, as shown in FIG. 8E, a concentric diffractive pattern 32b with four levels (steps) is produced from the diffractive pattern 40. Thus, an optical element 32 is accomplished.

Subsequently, the optical elements 31 and 32 are engaged and aligned with each other in the manner that two steps of the diffractive pattern 31b mate with one step of the diffractive pattern. Then, they are bonded to each other by using a predetermined adhesive agent or through optical contact.

An example of this aligning operation, alignment marks may be provided, for example, outside the effective diameters of the disk-like substrates 31a and 32a when the diffractive patterns 31b and 32b are produced. Furthermore, the optical elements 31 and 32 may be aligned with each other using these alignment marks as a reference.

Alternatively, small protrusions may be provided outside the effective diameters when the diffractive patterns 31b and 32b are produced. Then, the optical elements may be bonded with each other through the engagement of these small protrusions.

As a further alternative, while the optical function as a diffractive optical element (e.g., a diffraction efficiency) is monitored, the optical elements may be aligned with each other when they are placed in a state assuring a best function.

The closed space 33 may be held in a vacuum state in accordance with the property of the light source, or it may be sealingly filled with a predetermined gas. Specifically, the optical elements 31 and 32 may be bonded to each other in an environment such as a vacuum, dry air, or an inert gas such as nitrogen or helium.

Also, while the diffractive patterns 31b and 32b of the diffractive optical element 21 are placed in a pile so that they partially contact each other, the diffractive patterns may be placed in a pile so that they are held close to each other, but without contact to each other.

In the diffractive optical element 21 according to the first embodiment, the optical elements 31 and 32 which are components of the diffractive optical element are formed with diffractive patterns (step-like patterns) 31b and 32b, and these diffractive patterns 31b and 32b are optically superposed one upon another, by which a desired optical pattern as a whole is produced. Even if the desired optical pattern is extraordinarily fine and complex, the optical elements 31 and 32 may well have a relatively simple step-like pattern. With the superposition of the two step-like patterns, a pattern substantively equivalent to a desired pattern can be accomplished easily and assuredly.

As a result, an optical function equivalent to a multiple-step diffractive optical element which needs an extraordinarily fine pattern (e.g., a step-like pattern of eight levels) can be accomplished easily and assuredly. Thus, a diffractive optical element 21 of a high optical performance, being effective to prevent unwanted diffraction light or stray light, with improved diffraction efficiency, can be accomplished. When such a diffractive optical element 21 is incorporated into an optical system of a stepper, various optical aberrations such as chromatic aberration can be removed efficiently, and thus a high-precision stepper capable of providing highly uniform illumination can be attained.

Figure 9:
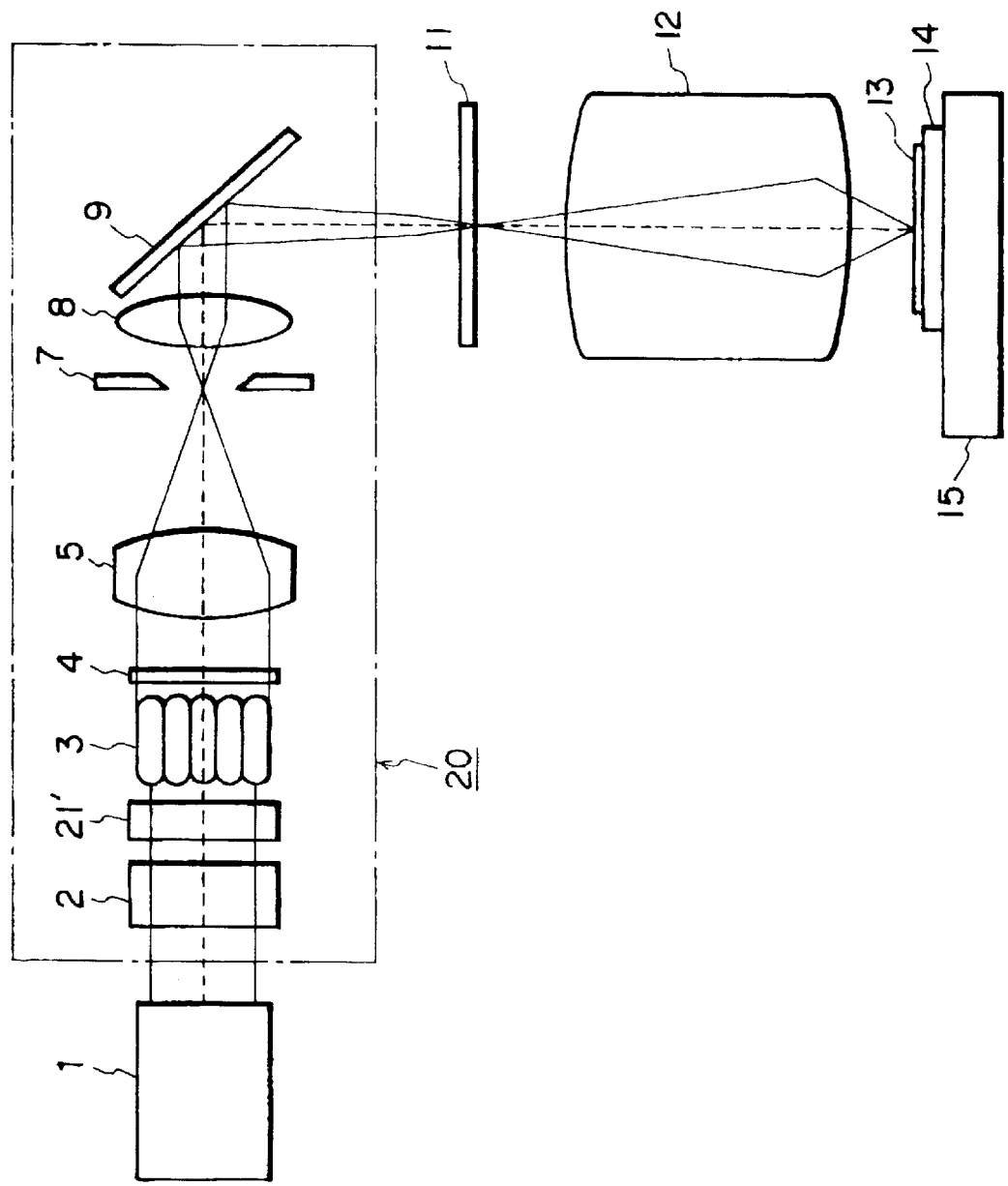
FIG. 9 is a schematic view of a general structure of a stepper, according to another example of the first embodiment of the present invention.

While in this embodiment the diffractive optical element 21 is included in the projection optical system 12 of the stepper, it may be provided in the illumination optical system 20, in place of the projection optical system 12, as shown in FIG. 9. Alternatively, both the projection optical system 12 and the illumination optical system 20 may have diffractive optical elements 21 and 21' of the present invention.

Several modifications of the first embodiment will be described below, with reference to FIGS. 10–14. In these modifications, those components having been described in relation to the first embodiment are denoted by corresponding reference numerals. Duplicate explanation of them will be omitted.

[Modification #1]

Figure 10:
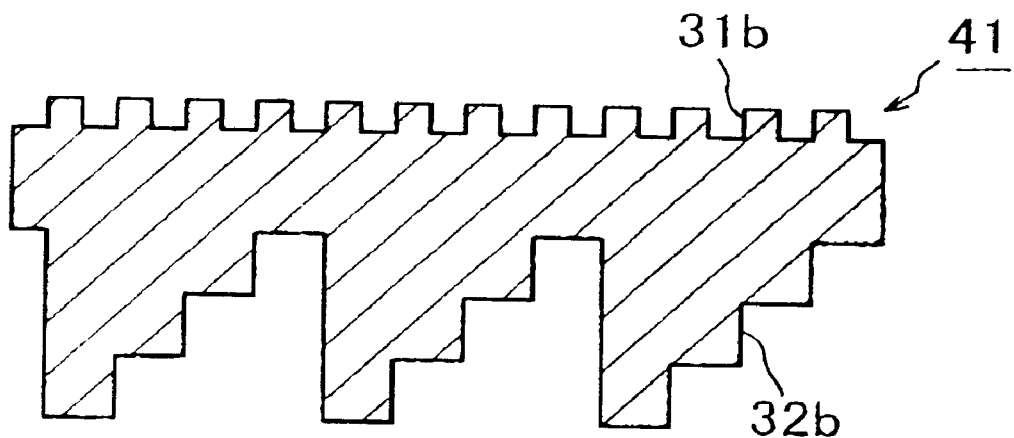
FIG. 10 is a schematic and sectional view of a diffractive optical element, according to a first modification.

FIG. 10 shows a diffractive optical element 41 in this modification. It comprises a thin disk-like substrate 42 having a two-level diffractive pattern 31b formed on its surface. It also has a four-level diffractive pattern 32b formed on the bottom face thereof. The diffractive patterns are so registered with each other that two steps of the diffractive pattern 31b are mated with one step of the diffractive pattern 32b. Optically viewing this while taking the vertical direction in FIG. 10 (longitudinal direction in the drawing) as an optical axis direction, the diffractive patterns 31b and 32b as placed in pile provide a combined step-like pattern structure of eight levels (steps). Namely, like the diffractive optical element 21 of the first embodiment, due to the combined function of the diffractive patterns 31b and 32b and in regard to the optical path lengths of eight light rays passing through each steps of the combined diffractive pattern structure, the diffractive optical element 41 is substantively equivalent to a diffractive optical element 37 (FIG. 6) having an eight-level diffractive pattern 38.

According to the first modification of diffractive optical element 41 described above, in addition to the advantages described with reference to the first embodiment, the diffractive optical element can be produced by processing a thin disk-like substrate. Therefore, it has the same size as a single diffractive optical element and is small in size.

[Modification #2]

Figure 11:
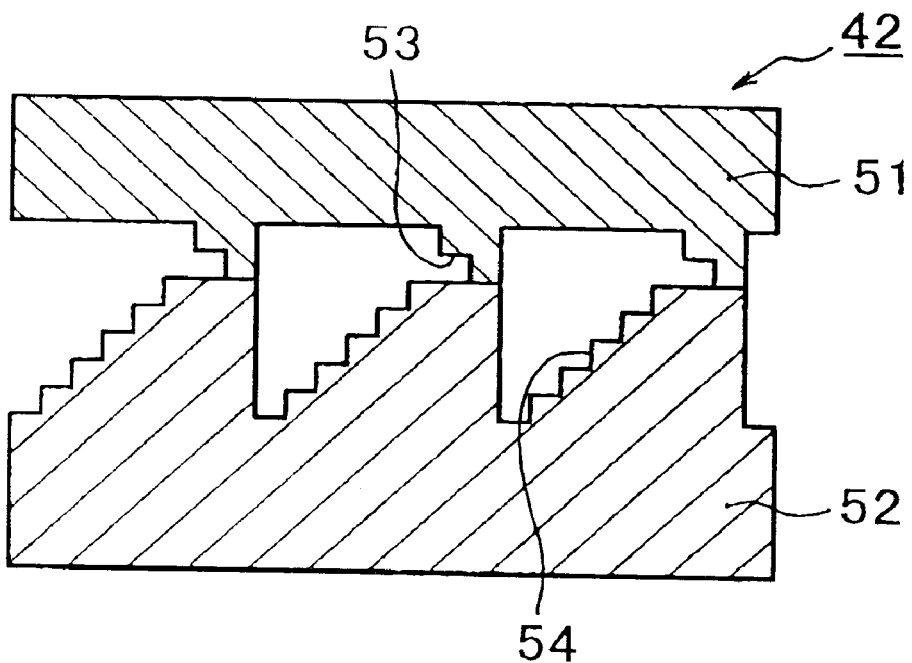
FIG. 11 is a schematic and sectional view of a diffractive optical element, according to a second modification.

FIG. 11 shows a diffractive optical element 42 according to a second modification. Like the diffractive optical element 21 of the first embodiment, the diffractive optical element 42 comprises two, upper and lower optical elements. However, as shown in FIG. 11, the upper optical element 51 is formed with a two-level diffractive pattern 53, while the lower optical element 52 is formed with a six-level diffractive pattern 54. These optical elements are registered with each other so that two steps of the diffractive pattern 53 are mated with one of every six steps. In this example, the two steps of the diffractive pattern 53 are combined with the six steps of the diffractive pattern 54. As a result, the structure becomes substantially equivalent to a diffractive optical element having a step-like pattern with eight levels, such as shown in FIG. 6.

In this manner, the desired number of steps (levels) can be produced not only by mating the steps of an upper optical element with the steps of the lower optical element (through multiple steps), but also by adding the steps of the upper and lower optical elements as in the second modification. Either of these forms may be chosen in light of any restrictions in the production process.

According to the second modification of diffractive optical element 42 described above, in addition to the advantageous effects having been described with reference to the first embodiment, the diffractive patterns of the upper and lower optical elements may be adjusted in accordance with various characteristics of the production process. Yet a desired diffractive optical element can be accomplished easily and assuredly.

[Modification #3]

Figure 12:
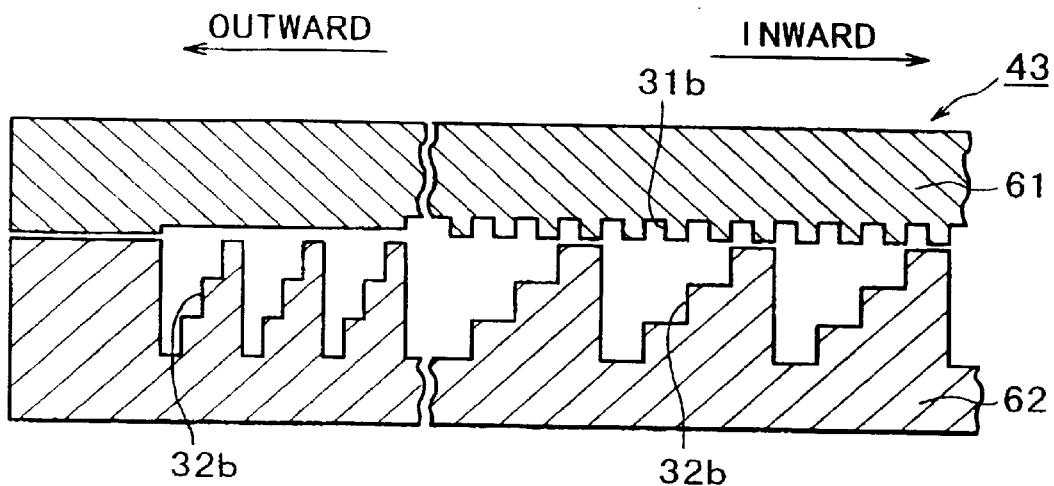
FIG. 12 is a schematic and sectional view of a diffractive optical element, according to a third modification.

FIG. 12 shows a diffractive optical element 43 according to a third modification. Like the diffractive optical element 21 of the first embodiment, the diffractive optical element 43 comprises two, upper and lower optical elements 61 and 62 that are aligned with each other so that their diffractive patterns partially contact each other. In addition to this, the diffractive optical element 43 is structured so that, because the pitch of the diffractive pattern should become narrower toward the outside of the concentric circles to meet a general requirement for a chromatic aberration correcting diffractive optical element, the diffractive pattern 31b is not formed in an outermost region on the optical element 61 (this should be done within a range that assures a sufficient diffraction efficiency and an influence thereof can be disregarded). Only a diffractive pattern 32b having a smaller pitch is formed at the corresponding portion of the optical element 62.

Figure 13:
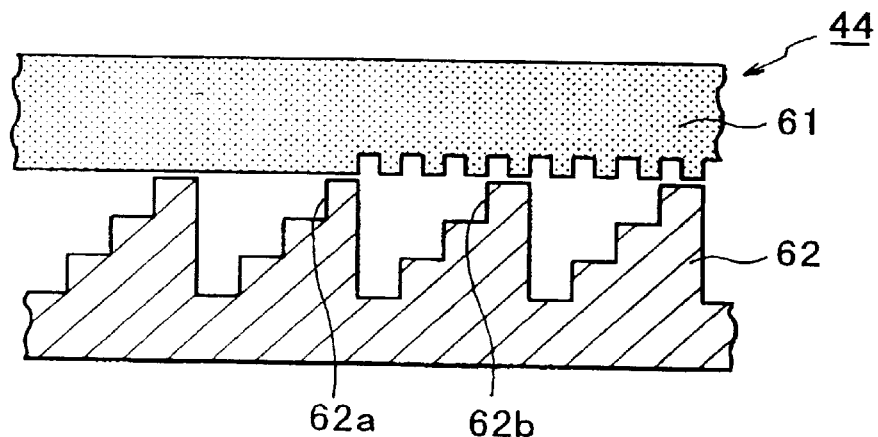
FIG. 13 is a schematic and sectional view of a diffractive optical element, according to another example of the third modification.

If diffractive patterns having different steps are formed on the same diffractive optical element, as in the third modification, there may be cases wherein the phase is discontinuous at the boundary where the steps change. In the third modification, in order to avoid such discontinuity in phase, the structure is made of the diffractive optical element 44 shown in FIG. 13. FIG. 13 is a sectional view for explaining the junction between a four-level portion and an eight-level portion of the combined diffractive pattern. The left-hand portion in FIG. 13 has a four-level structure, while the right-hand portion provides a diffractive pattern of an eight-level structure. In this example, the width of the rightmost step 62a of the four-level structure of the lower optical element 62 is made equal to ¾ of the width of the leftward step 62b. Thus, if the steps change, the discontinuity of phase can be avoided by changing the width of the step-like shape as described above.

Figure 14:
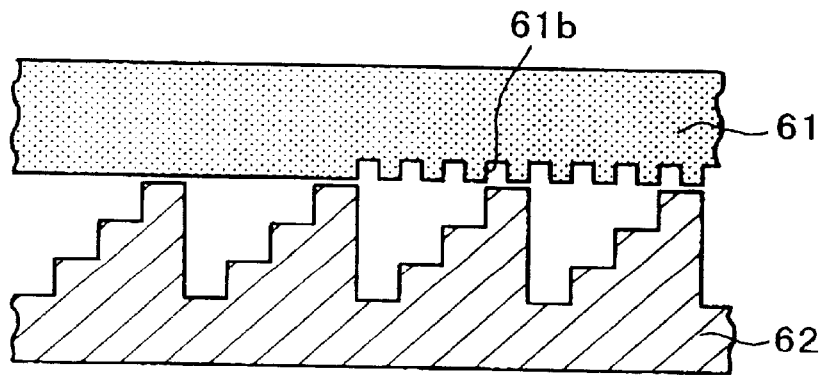
FIG. 14 is a schematic and sectional view of a diffractive optical element, according to a further example of the third modification.

Another example for avoiding phase discontinuity is shown in FIG. 14. In this example, a portion of an upper optical element 61 of a diffractive optical element 45 corresponding to the four-level steps has its thickness made thinner than the thickness of a portion corresponding to the eight-level steps (one-half the height of one step of a diffractive pattern 61b). By making the thickness of the portion of the optical element 61 corresponding to steps of smaller number of levels thinner, unwanted discontinuity of phase can be prevented.

According to the diffractive optical elements 43, 44 and 45 of the third modification described above, in addition to the advantageous effects of the first embodiment, an eight-level step-like pattern can be defined at an outer concentric circumferential regions where the patterning is relatively easy, by which a sufficient diffraction efficiency is assured. On the other hand, a four-level step-like pattern is formed at an innermost concentric circular region where the patterning is relatively difficult, such that positive patterning is assured. As a result, a diffractive optical element of a short focal length can be manufactured with a minimum reduction of diffraction efficiency.

Modifications of the first embodiment are not limited to those described above. For example, a diffractive pattern of a desired number of steps (levels) can be provided not only by combining two, upper and lower optical elements, but also by combining three or more optical elements each having a simple diffractive pattern. Further, one or more plural optical elements may be replaced by an optical element or elements according to the first modification described above.

Next, an example of a semiconductor device manufacturing method which uses a stepper described above, will be explained. It is to be noted that, in place of the diffractive optical element 21 of the first embodiment, a diffractive optical element according to any one of the modifications described above, may be incorporated into the stepper.

Figure 15:
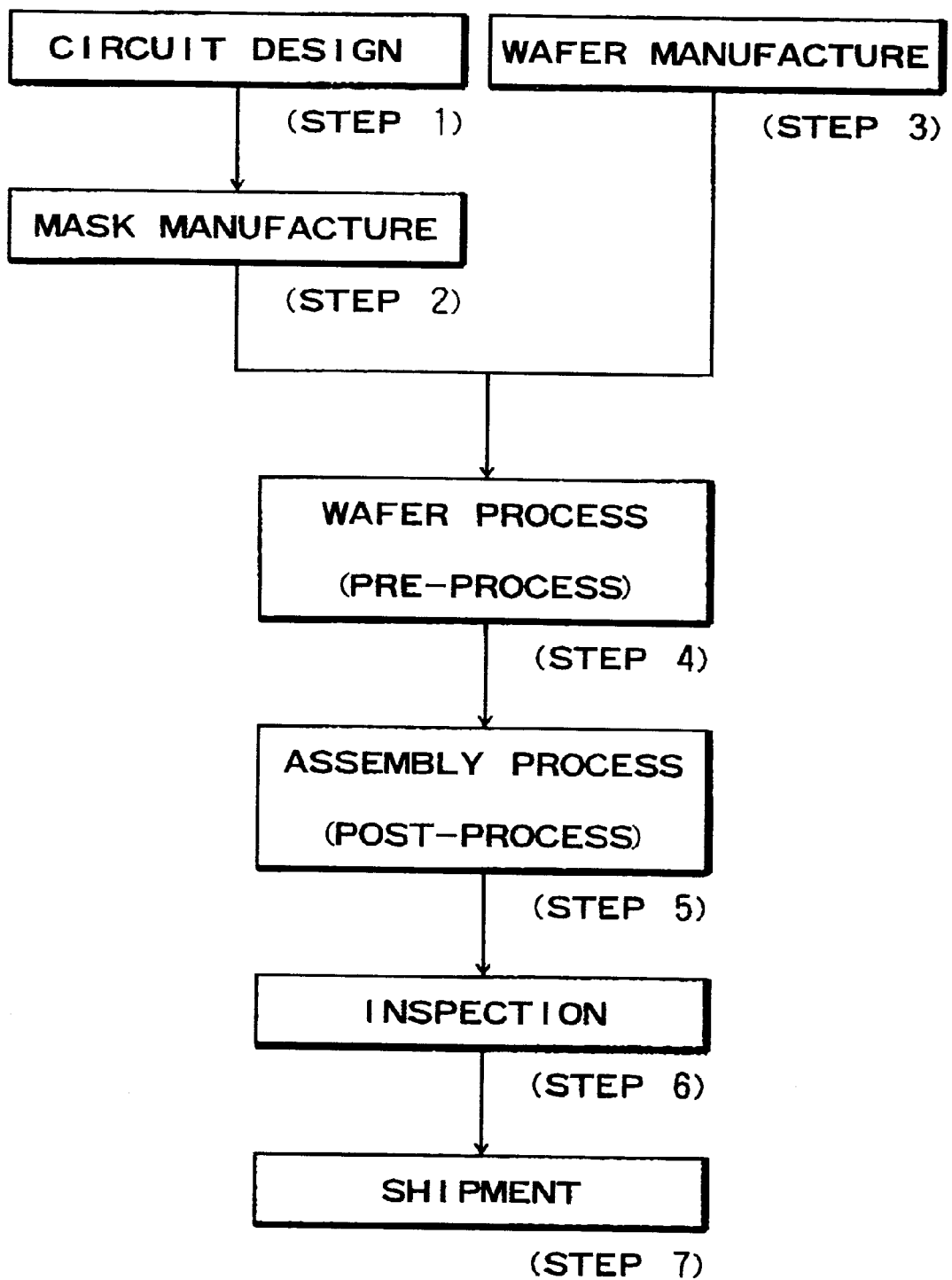
FIG. 15 is a flow chart for explaining semiconductor device manufacturing processes using a stepper according to the first embodiment of the present invention.

FIG. 15 is a flow chart of the procedure for the manufacture of microdevices such as semiconductor chips (e.g. ICs or LSIs), liquid crystal panels, and CCDs.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so prepared mask and wafer, circuits are practically formed on the wafer through lithography. Step 5 subsequent to this is an assembling step (called a post-process) wherein the wafer having been processed by step 4 is formed into semiconductor chips This step includes an assembling (dicing and bonding) process and a packaging (chip sealing) process. Step 6 is an inspection step wherein an operation check, a durability check, etc. for the semiconductor devices provided by step 5, are carried out. With these processes, semiconductor devices are completed and they are shipped (step 7).

Figure 16:
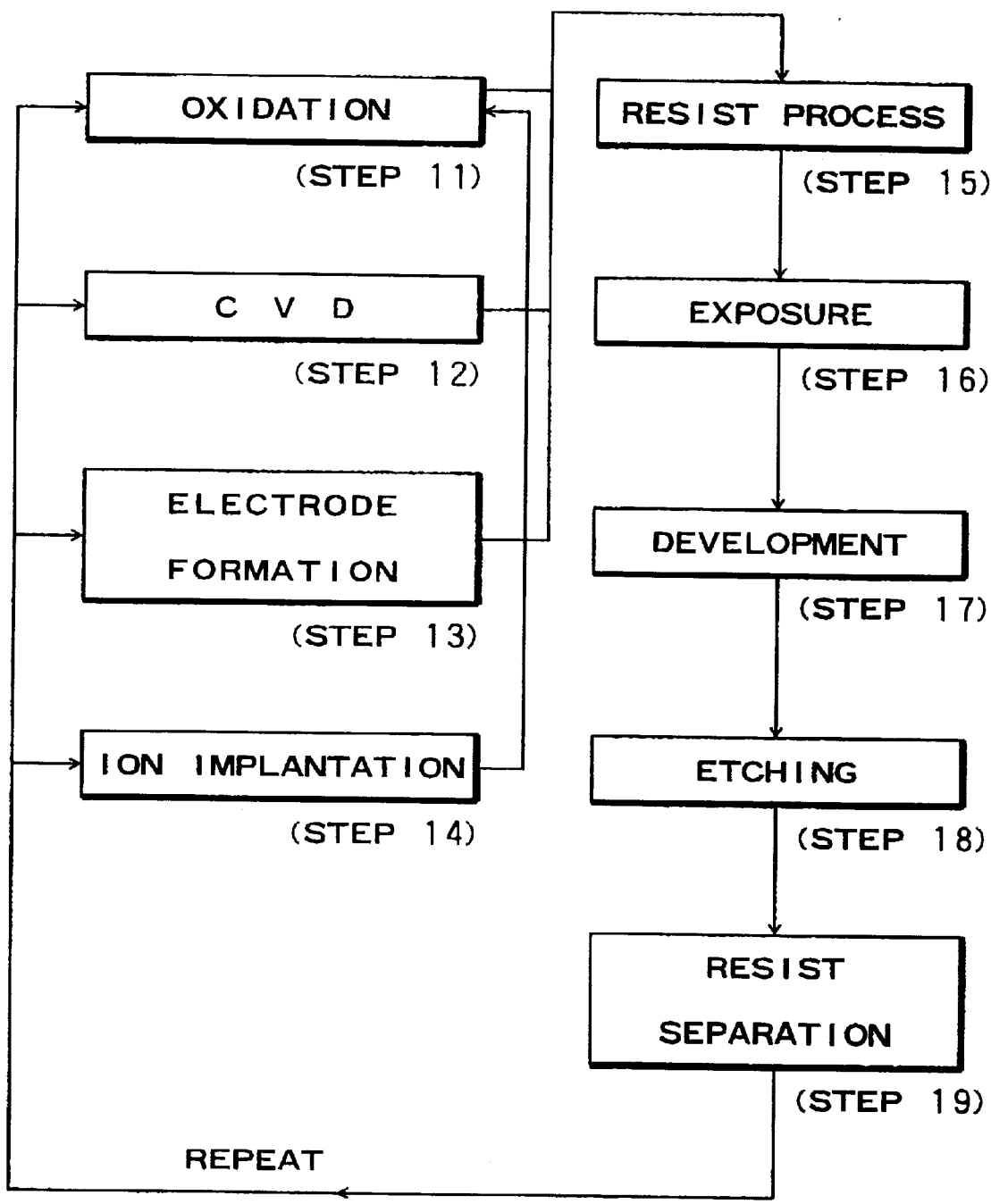
FIG. 16 is a flow chart for explaining details of the semiconductor device manufacturing processes.

FIG. 16 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes. circuit patterns are superposedly formed on the wafer.

In accordance with this device manufacturing method, a wafer can be illuminated with uniform illumination light while various optical aberrations are sufficiently corrected. Therefore, microdevices of higher density than conventionally attainable can be manufactured relatively easily.

The manufacturing method using the stepper according to the first embodiment is not limited to the production of semiconductor devices. It may be applied to various electronic elements or optical elements which need microprocessing based on photolithography. Namely, the manufacturing method can be applied to the formation of a diffractive pattern of an optical element which is a component of a diffractive optical element.

Second Embodiment

Figure 17:
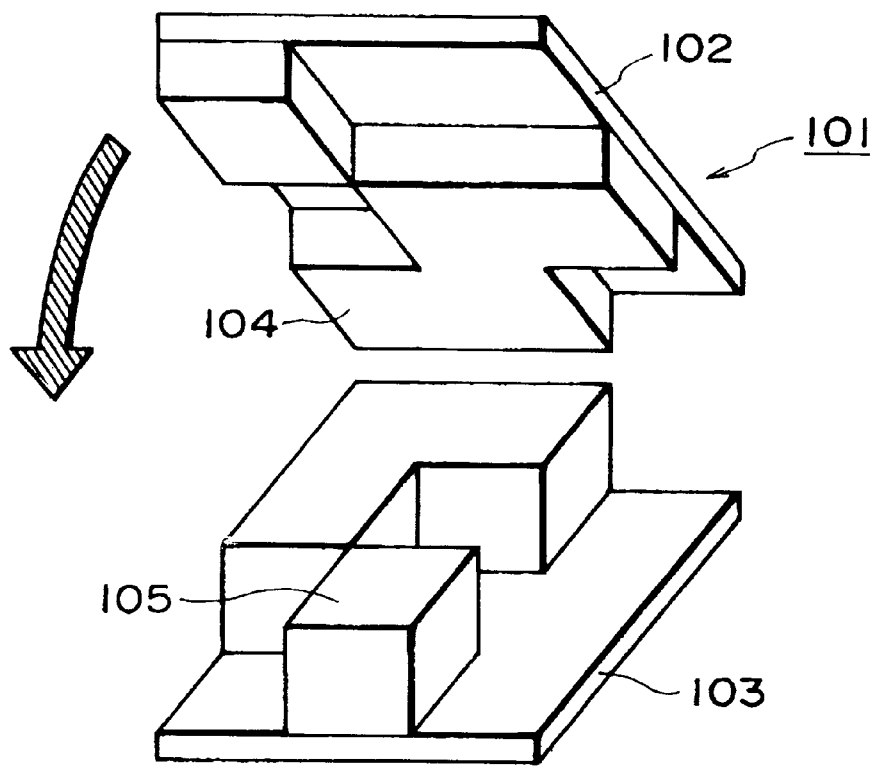
FIG. 17 is a schematic view for explaining a major structure of a computer hologram (CGH), according to a second embodiment of the present invention.
Figure 18:
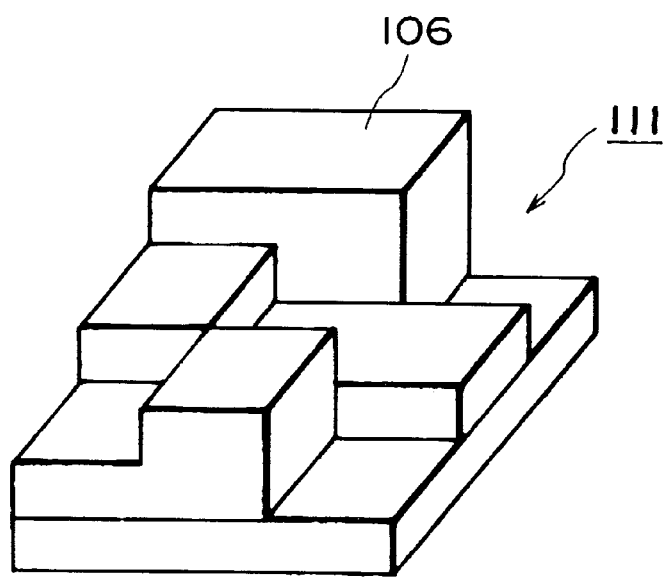
FIG. 18 is a schematic view for explaining a major structure of a computer hologram (CGH) with four levels.

A second embodiment of the present invention will now be described. FIG. 17 is a schematic view of a phase type computer hologram (CGH) 101 according to the second embodiment of the present invention, the illustrated hologram being in the course of production. Normally, such a computer hologram comprises a two-dimensional pattern as shown in FIG. 18 where, by patterning the surface of a substrate, a surface-irregularity pattern 106 having various surface levels is formed. When light passes therethrough, a predetermined light pattern is formed upon a predetermined projection plane on the basis of a holography. What is shown in FIG. 18 is an example of a computer hologram (CGH) 111 of a four-level (step) structure.

The computer hologram (CGH) 101 of the second embodiment, as shown in FIG. 17, has an upper optical element 102 on which a two-level surface-irregularity pattern 104 is formed, and a lower optical element 103 on which a two-level surface-irregularity pattern 105 is formed. These optical elements are mated with each other so that their patterns 104 and 105 engage with each other at predetermined portions. Then, they are bonded to each other. Here, optically viewing this while taking the vertical direction in the drawing (longitudinal direction in the drawing) as an optical axis direction, the patterns 104 and 105 are optically superposed one upon another and, as a result, a combined step-like pattern structure of four levels (steps) is provided. Namely, in regard to the optical path lengths of light rays passing through each of the steps of the combined surface-irregularity pattern structure, the computer hologram 101 is substantively equivalent to the computer hologram 111 (FIG. 18) having a four-level pattern 106.

Figure 19:
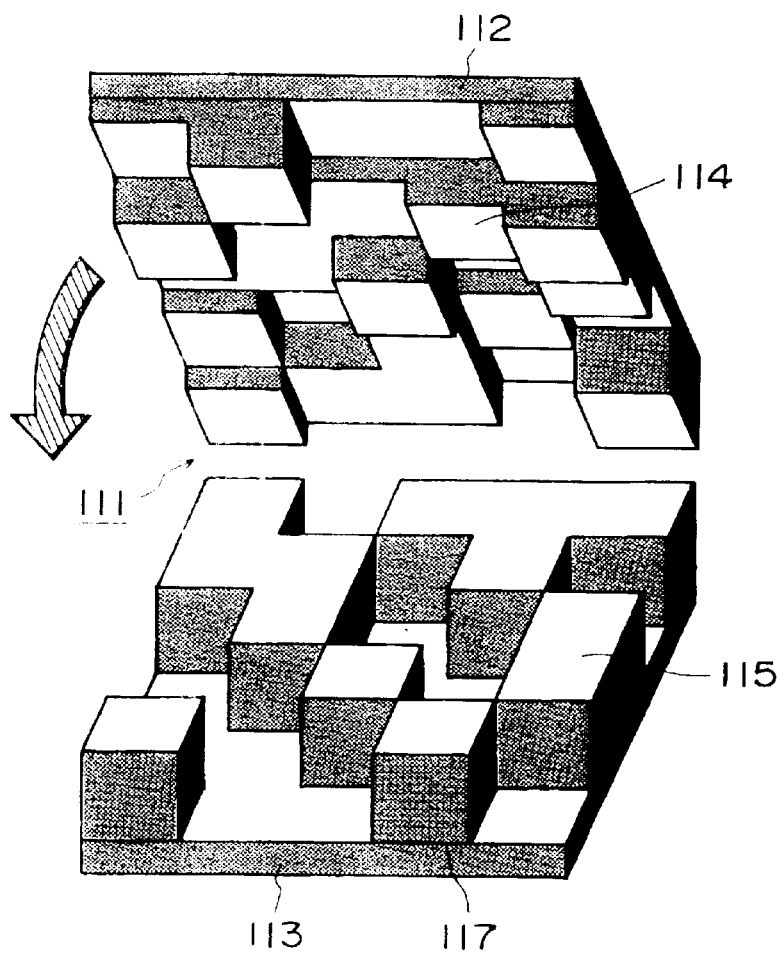
FIG. 19 is a schematic view for explaining a major structure of a computer hologram (CGH), according to another example of the second embodiment of the present invention.
Figure 20:
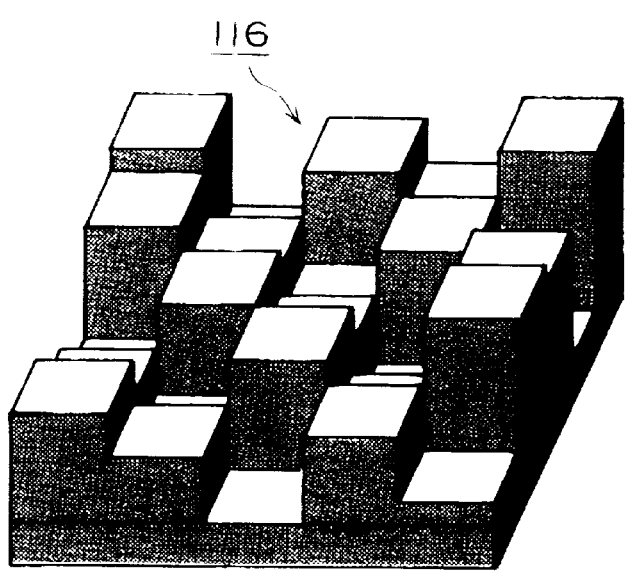
FIG. 20 is a schematic view for explaining a major structure of a computer hologram (CGH) with eight levels.

FIG. 19 shows another example wherein an upper optical element 112 having a four-level pattern 114 and a lower optical element 113 having a two-level pattern 115 are combined with each other to provide an eight-level structure. In this example, the level difference of the pattern 114 is made smaller than that of the pattern 115. In this computer hologram 111, the optical elements 112 and 113 are bonded with each other, while the patterns 114 and 115 engage with each other at their predetermined portions. Here, optically viewing this while taking the vertical direction in the drawing (i.e., longitudinal direction in the drawing) as an optical axis direction, the patterns 114 and 115 are optically superposed one upon another and, as a result, a combined step-like pattern structure of eight levels (steps) is provided. Namely, in regard to the optical path lengths of light rays passing through each of the steps of the combined surface-irregularity pattern structure, the computer hologram 111 in this example is substantively equivalent to a computer hologram 116 (FIG. 20) having an eight-level pattern.

When a computer hologram having a surface-irregularity pattern of an eight-level structure is to be produced, the eight-level structure can be accomplished by combining an etching depth of 4, an etching depth of 2 and an etching depth of 1. The most difficult to accomplish is the etching process of a depth 4. If an etching error of 10% depth in each etching process occurs, the error becomes large in the etching process depth of 4. In this embodiment, in consideration of it, the etching process of a depth 4 may preferably be performed only to a separate substrate, to produce the lower optical element 113. In this case, an etching stopper layer 117 may preferably by provided on the lower optical element 113, by which the etching depth 4 can be accomplished with no or very small depth error, More specifically, an etching stopper layer 117 made of $Al_2O_3$, $ZrO_2$, or $HfO_2$, for example, may be provided on a quartz substrate by vapor deposition, for example. Then, on the stopper layer, a transparent layer of $SiO_2$, SiO or $Si_3N_4$, for example, may be formed by deposition, with a predetermined thickness. Thereafter, a resist may be applied to the substrate and, then, by exposure, unwanted portions of the resist may be removed, and the transparent layer may be etched until the etching stopper layer 117 is reached. By using an etching stopper layer as described above, an even depth can be attained.

In the computer hologram (CGH) 101 of the second embodiment as described above, the optical elements 102 and 103 have surface-irregularity patterns (surface-step patterns) 104 and 105 formed thereon These patterns when combined provide a diffractive pattern of desired shape, as a whole. Even if the desired diffractive pattern to be produced is extraordinarily fine and complex, the optical elements 102 and 103 may well have relatively simple step-like patterns. By combining these patterns, a pattern which is substantially equivalent to a desired diffractive pattern with a large number of levels can be accomplished easily and assuredly.

A computer hologram of the second embodiment is not limited to what described above. For example, a pattern with desired levels (steps) can be accomplished not only by combining two, upper and lower optical elements, but also by combining three or more optical elements each having a simple surface-irregularity pattern.

While the invention has been described with reference to the structures disclosed herein, it is not confined to the details set forth and this application is intended to cover such modifications or changes as may come within the purposes of the improvements or the scope of the following claims.

What is claimed is:

1. A diffractive optical element, comprising a plurality of step-like patterns each having surface levels of a number less than eight, wherein said diffractive optical element is of a light-transmission type, wherein the sum or the product of the number of surface layers of each of said plurality of step-like patterns is at least eight, and wherein said plurality of step like patterns are disposed so that said diffractive optical element functions as a single step-like pattern having surface levels of a number of eight or more.

2. A diffractive optical element according to claim 1, wherein two of said plurality of step-like patterns are disposed parallel to and opposed to each other.

3. A diffractive optical element according to claim 1, wherein said step-like structure functions as a phase-type computer hologram for forming a desired light pattern.

4. A diffractive optical element according to claim 2, wherein a clearance is formed between the two step-like patterns opposed to each other, and wherein the clearance is held in a vacuum state or is sealingly filled with a predetermined fluid.

5. An optical system, comprising:
   a diffractive optical element as recited in claim 1; and
   at least one lens disposed in front of or at a back of said diffractive optical element.

6. A projection exposure apparatus, comprising:
   a light source for producing illumination light;
   a first optical system for projecting the illumination light to a reticle; and
   a second optical system for projecting a pattern of the reticle onto a substrate, with light passed through the reticle;
   wherein at least one of said first and second optical systems includes a diffractive optical element as recited in claim 1.

7. A device manufacturing method, comprising the steps of:
   applying a photosensitive material to a substrate;
   exposing the substrate coated with the photosensitive substrate with a device pattern, using an exposure apparatus as recited in claim 6; and
   developing the exposed substrate.

8. A diffractive optical element according to claim 1, wherein said plural step-like patterns are disposed sufficiently close to each other that they function as a single step-like pattern.

9. A diffractive optical element comprising a plurality of step-like patterns having surface levels of a number less than eight, wherein said diffractive optical element is of a light-transmission type, wherein two of said plurality of step-like patterns are disposed parallel to and opposed to each other, wherein the sum or the product of the number of surface layers of each of said plurality of step-like patterns is at least eight, and wherein said two step-like patterns are disposed so as to function as a single step-like pattern having surface levels of a number of eight or more.

10. A diffractive optical element according to claim 9, wherein one of said two step-like patterns has a step-like shape having two surface levels and the other has a step-like shape having four surface levels.

11. A diffractive optical element according to claim 10, wherein said two step-like patterns are disposed in contact with each other.

12. A diffractive optical element according to claim 9, wherein each step of said plurality of step-like patterns has a width of 1 micron or more, wherein each step of said step-like structure of eight or more levels has a width of 1 micron or less, and wherein said step-like structure as a whole can serve as a diffractive optical element for diffracting light, incident thereon, at a desired deflection or diffraction angle.

13. A diffractive optical element according to claim 9, wherein said step-like structure functions as a phase-type computer hologram for forming a desired light pattern.

14. A diffractive optical element according to claim 9, wherein a clearance is formed between said two step-like patterns opposed to each other, and wherein the clearance is held in a vacuum state or is sealingly filled with a predetermined fluid.

* * * * *

UNITED STATES PATENT AND TRADEMARK OFFICE
CERTIFICATE OF CORRECTION

PATENT NO. : 6,462,875 B1
DATED : October 8, 2002
INVENTOR(S) : Hiroyuki Ishii

It is certified that error appears in the above-identified patent and that said Letters Patent is hereby corrected as shown below:

Column 4,
Line 48, "shapes" should read -- shape --.

Column 5,
Line 44, "a gas" should read -- gas --.

Column 6,
Line 28, "An" should read -- As an --.

Column 7,
Line 41, "each steps" should read -- each step --.

Column 8,
Line 62, "regions" should read -- region --.

Column 9,
Line 54, "processes." should read -- processes, --.

Column 11,
Line 23, "described" should read -- is described --; and
Line 40, "step like" should read -- step-like --.

Signed and Sealed this

Twenty-ninth Day of June, 2004

JON W. DUDAS
*Acting Director of the United States Patent and Trademark Office*